United States Patent
Henry et al.

(10) Patent No.: US 11,111,415 B2
(45) Date of Patent: Sep. 7, 2021

(54) CHEMICAL MECHANICAL PLANARIZATION OF FILMS COMPRISING ELEMENTAL SILICON

(71) Applicant: Versum Materials US, LLC, Tempe, AZ (US)

(72) Inventors: James Matthew Henry, Fountain Hill, AZ (US); Hongjun Zhou, Chandler, AZ (US); Krishna P. Murella, Phoenix, AZ (US); Dnyanesh Chandrakant Tamboli, Gilbert, AZ (US); Joseph Rose, Chandler, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/593,268

(22) Filed: Oct. 4, 2019

(65) Prior Publication Data

US 2020/0032108 A1    Jan. 30, 2020

Related U.S. Application Data

(63) Continuation of application No. 15/901,317, filed on Feb. 21, 2018, now abandoned.

(60) Provisional application No. 62/464,680, filed on Feb. 28, 2017.

(51) Int. Cl.

| | |
|---|---|
| *C09G 1/02* | (2006.01) |
| *B24B 37/24* | (2012.01) |
| *H01L 21/306* | (2006.01) |
| *C09G 1/00* | (2006.01) |
| *C09G 1/04* | (2006.01) |
| *C09K 3/14* | (2006.01) |
| *B24B 1/00* | (2006.01) |
| *C09K 13/06* | (2006.01) |
| *B24B 37/04* | (2012.01) |
| *H01L 21/304* | (2006.01) |
| *H01L 21/321* | (2006.01) |
| *C09G 1/06* | (2006.01) |

(52) U.S. Cl.
CPC .................. *C09G 1/02* (2013.01); *B24B 1/00* (2013.01); *B24B 37/044* (2013.01); *B24B 37/245* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/304* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | |
|---|---|---|
| 3,429,080 A | 2/1969 | Lachapelle |
| 6,533,832 B2 | 3/2003 | Steckenrider et al. |
| 7,585,340 B2 | 9/2009 | Dysard et al. |
| 8,157,877 B2 | 4/2012 | Ikeda et al. |
| 8,597,540 B2 | 12/2013 | De Rege Thesauro et al. |
| 8,741,009 B2 | 6/2014 | Dysard et al. |
| 2002/0095872 A1 | 7/2002 | Tsuchiya |
| 2003/0196386 A1 | 10/2003 | Hattori et al. |
| 2007/0069176 A1* | 3/2007 | Kato ............... C09K 3/1463 252/79.1 |
| 2009/0165395 A1 | 7/2009 | Ikeda |
| 2011/0045741 A1 | 2/2011 | Ahn et al. |
| 2011/0136344 A1* | 6/2011 | Reiss ............. H01L 21/02024 438/693 |
| 2013/0109182 A1 | 5/2013 | Guo et al. |
| 2014/0152309 A1 | 6/2014 | Kozlov et al. |
| 2014/0191155 A1 | 7/2014 | Reiss et al. |
| 2016/0027657 A1 | 1/2016 | Shi |
| 2016/0358790 A1 | 12/2016 | Shi et al. |
| 2019/0172720 A1 | 6/2019 | Shi et al. |

FOREIGN PATENT DOCUMENTS

| | | |
|---|---|---|
| CN | 101358125 A | 2/2009 |
| CN | 102441819 A | 5/2012 |
| EP | 1357161 A2 | 10/2003 |
| EP | 3101076 A1 | 12/2016 |
| JP | 201108811 A2 | 6/2011 |
| WO | 12083115 A2 | 6/2012 |

OTHER PUBLICATIONS

XP002780593, Database WPI; Week 201572; Thomson Scientific, London, GB; AN 2015-51923T,-& CN 104 745 093 A (Anji Microelectronics Co. Ltd.); Jul. 1, 2015, abstract, paragraphs [0006]-[0063].

XP002780594, Database WPI; Week 201137; Thomson Scientific, London, GB; AN 2011-F94618,-& JP 2011 108811 A (Asahi Glass Co. Ltd.); Jun. 2, 2011; abstract, paragraphs [0113], [0138]-[0142]; examples 5,6; table 6.

* cited by examiner

*Primary Examiner* — Jiong-Ping Lu
(74) *Attorney, Agent, or Firm* — Lina Yang

(57) ABSTRACT

Chemical Mechanical Planarization (CMP) polishing compositions comprising abrasive particles and additives to boost removal rates of films comprising elemental silicon such as poly-silicon and Silicon-Germanium.

13 Claims, No Drawings

CHEMICAL MECHANICAL PLANARIZATION OF FILMS COMPRISING ELEMENTAL SILICON

CROSS-REFERENCE TO RELATED APPLICATIONS

This application is a continuation application of U.S. application Ser. No. 15/901,317 filed on Feb. 21, 2018 which claims priority to U.S. provisional application Ser. No. 62/464,680 filed on Feb. 28, 2017; the entire contents of which is incorporated herein by reference thereto for all allowable purposes.

BACKGROUND OF THE INVENTION

The present invention relates to chemical mechanical planarization ("CMP") polishing compositions (CMP slurries, CMP composition or CMP compositions are used interchangeably) used in the production of a semiconductor device, and polishing methods for carrying out chemical mechanical planarization. In particular, it relates to polishing compositions for polishing of films comprising elemental forms of silicon such as poly-Si, amorphous Si or Si—Ge.

Si containing films have been used in semiconductor industry for a long time. There have many approaches taken to polish Si containing films at high removal rates.

U.S. Pat. No. 3,429,080 discloses using oxidizing agents to boost removal rates of crystalline Si films. US2013109182 disclose compositions comprising diquaternary cations for polishing poly-Si films at high rates relative to silicon nitride. U.S. Pat. No. 6,533,832 describes increased selectivity to poly-Si polishing using alcohol amine compounds. U.S. Pat. No. 7,585,340 discloses compositions comprising polyetheramine compounds that yield high poly Si removal rates relative to other films.

Despite these polishing compositions and methods, there remains a need in the art for polishing compositions and methods that can provide high removal rates for films comprising elemental silicon and a controlled selectivity of removal rates between films comprising elemental silicon and other films such as silicon oxide and silicon nitride. The compositions and methods of this invention provides these inventive features as it will be apparent from the description of the invention provided herein.

BRIEF SUMMARY OF THE INVENTION

Described herein are silicon containing material CMP polishing compositions, methods and systems that satisfy the need.

In one embodiment, described herein is a polishing composition comprising abrasive particles, a liquid carrier and a compound to boost the removal rates of films comprising elemental silicon, which is selected from a group consisting of (i) heterocycle carbon compound comprising sulfur or nitrogen or both sulfur and nitrogen as heteroatoms and a carbonyl group attached to the ring structure (ii) Heterocycle carbon compound comprising sulfur or nitrogen or both sulfur and nitrogen as heteroatoms (iii) Aldehyde or ketone compound.

In a preferred embodiment, the compound to boost the removal rates of films comprising elemental silicon is a heterocyclic carbon compound comprising both sulfur and nitrogen heteroatoms along with a carbonyl group attached to the carbon ring.

In a further preferred embodiment, the compound to boost the removal rates of films comprising elemental silicon is a isothiazolinone compound. Examples of chemical isothiazolinone compounds include but not limited to methylisothiazolinone (MIT), chloromethylisothiazolinone (OMIT), benzisothiazolinone (BIT), octylisothiazolinone (OIT), dichlorooctylisothiazolinone (DCOIT) and butylbenzisothiazolinone (BBIT).

In a further embodiment, the polishing composition comprises one or more abrasive particle selected from a group consisting of silicon oxide, cerium oxide or a composite particle comprising silicon oxide and cerium oxide; and methylisothiazolinone as the compound to boost removal rates of films comprising elemental silicon.

In a further embodiment, the polishing composition comprises one or more abrasive particle selected from a group consisting of silicon oxide, cerium oxide or a composite particle comprising silicon oxide and cerium oxide; methylisothiazolinone as the compound to boost removal rates of films comprising elemental silicon; and an additive to suppress removal rate of silicon nitride films.

In a further embodiment, the polishing composition comprises one or more abrasive particle selected from a group consisting of silicon oxide, cerium oxide or a composite particle comprising silicon oxide and cerium oxide; methylisothiazolinone as the compound to boost removal rates of films comprising elemental silicon; and a polymer or co-polymer containing acrylic acid group.

In a further embodiment, the polishing composition comprises a cerium oxide containing abrasive, a silica abrasive, methylisothiazolinone as the compound to boost removal rates of films comprising elemental silicon; and a polymer or co-polymer containing acrylic acid group as an additive to suppress removal rate of silicon nitride films.

Polishing compositions may also comprise other types of additives such as surfactants, dispersants, corrosion inhibitors, biocides, pH adjusting agents, pH buffering compounds, etc.

Polishing compositions of this invention may comprise abrasive particles in the concentration range of 0.01 wt. % to about 15 wt. %, or more preferably between 0.1 wt. % to about 5 wt. %, or most preferably between 0.2 wt. % to about 3 wt. %.

Compound to boost removal rate of films comprising elemental silicon may be present in the range of 0.0001 wt. % to 1 wt. %, or more preferably between 0.001 wt. % to 0.5 wt. %, or most preferably between 0.01 wt. % and 0.2 wt. %.

Typically, pH of the polishing composition is between 1 and 13, preferably between 2 and 12 and more preferably between 3 and 11.

The present invention provides a polishing composition comprising:
abrasive particles ranging from 0.01 wt. % to 15 wt. %;
a compound to enhance removal rate of films comprising elemental silicon ranging from 0.001 wt. % to 0.5 wt. %; and
liquid carrier; and
pH of the polishing composition is between 2 and 12;
wherein
one or more kinds of abrasive is selected from the group consisting of fumed silica, colloidal silica, fumed alumina, colloidal alumina, cerium oxide, ceria-silica composite particles, titanium dioxide, zirconium oxide, polystyrene, polymethyl methacrylate, mica, hydrated aluminum silicate, and mixtures thereof; and
the compound to enhance removal rate of films comprising elemental silicon is selected from a group consisting of (i) heterocycle carbon compound comprising sulfur or nitrogen or both sulfur and nitrogen as heteroatoms and a carbonyl group attached to the ring structure; (ii) heterocycle carbon compound comprising sulfur or nitrogen or both sulfur and nitrogen as heteroatoms; (iii) an aldehyde or a ketone compound; and combinations thereof.

The present invention provides a polishing method for chemical mechanical planarization of a semiconductor substrate comprising at least one surface containing elemental silicon, comprising the steps of:
  contacting the at least one surface containing elemental silicon with a polishing pad;
  delivering a polishing composition to the at least one surface containing elemental silicon;
  wherein the polishing composition comprising:
    abrasive particles ranging from 0.01 wt. % to 15 wt. %;
    a compound to enhance removal rate of films comprising elemental silicon ranging from 0.001 wt. % to 0.5 wt. %; and
    liquid carrier; and
    pH of the polishing composition is between 2 and 12;
    wherein
      one or more kinds of abrasive is selected from the group consisting of fumed silica, colloidal silica, fumed alumina, colloidal alumina, cerium oxide, ceria-silica composite particles, titanium dioxide, zirconium oxide, polystyrene, polymethyl methacrylate, mica, hydrated aluminum silicate, and mixtures thereof; and
      the compound to enhance removal rate of films comprising elemental silicon is selected from a group consisting of isothiazolinone and derivatives, thiazolinone and derivatives, imidazolidine and derivatives, pyrozolidine and derivatives, imidazole and derivatives, pyrazole and derivatives, thiazole and derivatives, isothiazole and derivatives, thiazolidine and derivatives, isothiazolidine and derivatives, dithiolane and derivatives, triazole and derivatives, tetrazole and derivatives, thiadiazole and derivatives, and combinations thereof; acetone, benzophenone, acetophenone, acetylacetone, butanol, 3-hydroxybutanal, p-nitrobenzenzaaldehyde, cinnamaldehyde, vanillin, and combinations thereof;
    and
  polishing the at least one surface containing elemental silicon with the polishing composition.

The present invention provides a polishing system for chemical mechanical planarization a semiconductor substrate comprising at least one surface containing elemental silicon, comprising:
  the semiconductor substrate;
  a polishing pad; and
  the polishing composition comprising:
    abrasive particles ranging from 0.01 wt. % to 15 wt. %;
    a compound to enhance removal rate of films comprising elemental silicon ranging from 0.001 wt. % to 0.5 wt. %; and
    liquid carrier; and
    pH of the polishing composition is between 2 and 12;
    wherein
      the abrasive is selected from the group consisting of fumed silica, colloidal silica, fumed alumina, colloidal alumina, cerium oxide, ceria-silica composite particles, titanium dioxide, zirconium oxide, polystyrene, polymethyl methacrylate, mica, hydrated aluminum silicate, and mixtures thereof; and
      the compound to enhance removal rate of films comprising elemental silicon is selected from a group consisting of isothiazolinone and derivatives, thiazolinone and derivatives, imidazolidine and derivatives, pyrozolidine and derivatives, imidazole and derivatives, pyrazole and derivatives, thiazole and derivatives, isothiazole and derivatives, thiazolidine and derivatives, isothiazolidine and derivatives, dithiolane and derivatives, triazole and derivatives, tetrazole and derivatives, thiadiazole and derivatives, and combinations thereof; acetone, benzophenone, acetophenone, acetylacetone, butanol, 3-hydroxybutanal, p-nitrobenzenzaaldehyde, cinnamaldehyde, vanillin, and combinations thereof;
    wherein the semiconductor substrate is in contact with the polishing composition and the pad.

The compound to enhance removal rate of films comprises elemental silicon can be selected from a group consisting of (i) isothiazolinone and derivative selected from the group consisting of methylisothiazolinone (MIT), chloromethylisothiazolinone (OMIT), benzisothiazolinone (BIT), octylisothiazolinone (OIT), dichlorooctylisothiazolinone (DCOIT), butylbenzisothiazolinone (BBIT), and combinations thereof; and (ii) thiazolinone and derivative selected from the group consisting of 2-Benzothiazol-1,1,3-trione (Saccharin), N-methyl 2-Benzothiazolinone, thiazolinone, and combinations thereof; and combinations thereof.

The semiconductor substrate further comprises at least one surface containing silicon oxide, silicon nitride or combinations thereof; and the polishing composition further comprises from 0.1 ppm to 0.5 wt. % of an additive having a functional group selected from the group consisting of organic carboxylic acids and salts thereof, amino acids and salts thereof, amidocarboxylic acids and salts thereof, N-acylamino acids and salts thereof, organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof; or combinations of (i) and (ii);

The disclosed method and the system can provide a tunable removal rate selectivity between elemental silicon and silicon oxide or silicon nitride between 0.1 to 110.

DETAILED DESCRIPTION OF THE INVENTION

Polishing compositions of this invention are useful for polishing films comprising elemental silicon at high removal rates.

Films comprising elemental silicon comprise various types of films containing silicon in which chemical bonding of silicon with other elements is substantially absent. Films comprising elemental silicon include various crystalline forms of silicon such as polycrystalline (also referred to as poly-Si), amorphous silicon (referred to as a-Si) or single crystal.

Films comprising elemental silicon may also comprise various doping or alloying additives. Examples of doping or alloying additives include but not limited to germanium, phosphorous, boron, aluminum, nitrogen, gallium, indium, arsenic, antimony, lithium, xenon, gold, platinum. The relative ratio of atoms between the doping or alloying additives and I silicon in the film could range from 1E-10 to 99.99999.

In one embodiment, polishing compositions are used to polish two or more films simultaneously wherein at least one of the films comprises elemental silicon and at least one other film comprises a compound of silicon.

Film comprising compound of silicon may comprise various types films including but not limited to silicon oxide, silicon nitride, silicon carbide, silicon oxy-carbide, silicon oxy-nitride. Examples of silicon oxide films include but not limited to thermal oxide, Tetra Ethyl Ortho Silicate (TEOS), High Density Plasma (HDP) oxide, High Aspect Ratio Process (HARP) films, fluorinated oxide films, doped oxide films, organosilicate glass (OSG) low-K dielectric films, Spin-On Glass (SOG), flowable Chemical Vapor Deposited (CVD) films, optical glass, display glass.

Polishing compositions of this invention can achieve a range of removal rate selectivity between the films comprising elemental silicon and films comprising compounds of silicon.

In some embodiments, removal rates of films comprising elemental silicon can be very high compared to films comprising compounds of silicon. For example, polishing composition can polish poly-Si at very high rates compared to silicon oxide and/or silicon nitride films with removal rate selectivity greater than 20.

In some other embodiments, polishing compositions can polish both poly-Si and silicon oxide at very high rates, with removal rate selectivity between poly-Si and silicon oxide less than 5.

In certain embodiments, all the three films poly-Si, silicon oxide and silicon nitride are all polished at comparable removal rates, wherein the ratio of removal rates between any two films is less than 5.

In certain embodiments, poly-Si films are polished at removal rates which are 1.5 times or more preferably more than 2 times silicon oxide removal rate, while the removal rate selectivity between poly-Si and SiN is greater than 25.

In some embodiments, polishing compositions of this invention may be used to polish films comprising elemental silicon at removal rates greater than 500 Å/min, or more preferably more than 1000 Å/min, or most preferably more than 1500 Å/min. In some embodiments, removal rates of films comprising elemental silicon is greater than 1000 Å/min, while the silicon oxide removal rate is less than 50 Å/min. In some embodiments, removal rates of films comprising elemental silicon is greater than 1000 Å/min, while the silicon oxide removal rate is greater than 500 Å/min.

These compositions can be used in a variety of applications including but not limited to Shallow Trench Isolation (STI), Inter Layer Dielectric (ILD) polish, Inter Metal Dielectric (IMD) polish, through silicon via (TSV) polish and bare wafer polishing.

In one embodiment, described herein is a polishing composition comprising abrasive particles, a liquid carrier and a compound to boost the removal rates of films comprising elemental silicon, which is selected from a group consisting of (i) heterocycle carbon compound comprising sulfur or nitrogen or both sulfur and nitrogen as heteroatoms and a carbonyl group attached to the ring structure (ii) heterocycle carbon compound comprising sulfur or nitrogen or both sulfur and nitrogen as heteroatoms (iii) aldehyde or a ketone compound.

Heterocyclic carbon compound can be defined as a cyclic compound or a ring structure with at least two different elements including carbon. Heteroatoms may comprise one or more atoms selected from carbon, nitrogen and oxygen. Heterocyclic ring may comprise 3 to 7 atoms as members. Heterocyclic ring may also be fused with benzene rings.

Examples of heterocycle carbon compounds having both carbon and nitrogen and a carbonyl group attached to the ring include but not limited to isothiazolinone, thiazolinone and their derivative compounds.

Examples of chemical isothiazolinone compounds include but not limited to methylisothiazolinone (MIT), chloromethylisothiazolinone (OMIT), benzisothiazolinone (BIT), octylisothiazolinone (OIT), dichlorooctylisothiazolinone (DCOIT) and butylbenzisothiazolinone (BBIT).

Examples of thiazolinone compounds include but not limited to 2-Benzothiazol-1,1,3-trione (Saccharin), N-methyl 2-Benzothiazolinone and thiazolinone.

Examples of heterocycle carbon compounds comprising sulfur or nitrogen or both as heteroatoms include but not limited to imidazolidine, pyrozolidine, imidazole, pyrazole, thiazole, isothiazole, thiazolidine, isothiazolidine, dithiolane, triazole, tetrazole, thiadiazole, and derivatives thereof.

Examples of an aldehyde or a ketone compound include but not limited to acetone, benzophenone, acetophenone, acetylacetone, butanol, 3-hydroxybutanal, p-nitrobenzenzaaldehyde, cinnamaldehyde, vanillin.

Compound to boost removal rate of films comprising elemental Si may be present in the CMP composition in the range of 0.0001 wt. % to 1 wt. %, or more preferably between 0.001 wt. % to 0.5 wt. %, or most preferably between 0.01 wt. % and 0.2 wt. %.

CMP compositions of this invention comprise abrasive particles.

Abrasive particles can be selected from a wide range of particles, but not limited to fumed silica, colloidal silica, silica doped with aluminum, fumed alumina, colloidal alumina, cerium oxide, ceria-silica composite particles, titanium dioxide, zirconium oxide, polystyrene, polymethyl methacrylate, mica, hydrated aluminum silicate, and mixtures thereof.

Polishing compositions comprising silica or alumina particles may be preferred for polishing films comprising elemental silicon at higher removal rate selectivity relative to silicon oxide films.

Polishing compositions comprising silica or alumina particles for example may be used to polish wafers when desired removal rate selectivity between films comprising elemental silicon and silicon oxide films is greater than 20, or more preferably greater than 30 or most preferably more than 50.

Polishing compositions comprising cerium oxide or ceria-silica composite particles may be more suitable for applications which require high removal rates for both elemental silicon films and silicon oxide films.

Polishing compositions comprising cerium oxide or ceria-silica composite particles for example may be used to polish wafers when desired removal rate selectivity between films comprising elemental silicon and silicon oxide films is less than 10, or more preferably less than 5 or most preferably less than 2.

The mean particle size of abrasive particles can be measured by a suitable technique such as dynamic light scattering.

The mean particle size of silica and alumina particles can be between 10 nm and 500 nm, more preferably between 20 nm and 150 nm, most preferably between 30 and 80 nm.

The mean particle size ceria or ceria-silica composite particles can be between 10 nm and 5000 nm, or more preferably between 50 nm and 300 nm and most preferably between 75 nm and 200 nm.

Ceria particles may be manufactured by any suitable techniques including calcination-milling or colloid formation through liquid processing. Ceria particles may be single crystalline or polycrystalline. In certain cases the surface may also be in hydroxylated form.

In some embodiments, composite particles, such as ceria-silica composite particles with ceria coated on the surface of silica particle core may be preferred.

Ceria coating on silica core may be in the form of continuous shell like structure or in the form of discreet ceria nano particles on the surface of silica particles.

In some embodiments, silica core particles are amorphous; and the ceria nanoparticles are singly crystalline.

In some preferred embodiments, the ceria coated silica particles would comprise a silica core with mean particle size in the range of 50 to 200 nm, decorated with ceria nano particles of size as measured by transmission electron microscope imaging is between 1 nm and 30 nm, or more preferably between 10 nm and 20 nm.

In certain embodiments the ceria nano particles covering the silica core particle may have a partial silica coating on the surface.

Ceria-silica composite particles can be manufactured by the methods described by any suitable method. A method described in WO2016159167 may be especially suitable for manufacturing ceria coated silica particles for improved performance.

Another aspect of the present invention, involves using of ceria coated silica particles that do not disintegrate under polishing forces. It is hypothesized that if the particles do not breakdown under the action of polishing forces (i.e. disintegrative forces) and keep the characteristic of original particle size, then the removal rate would remain high. If the particles on the other hand disintegrates under polishing forces, the removal rate would decrease owing to effectively smaller abrasive particle size. Breaking of the particles may also yield irregular shaped particles which may have undesirable effect on scratching defects. Particle stability under disintegrative forces can also be determined by subjecting the composition to the ultrasonication treatment for half an hour and measuring the changes in size distribution.

Preferred conditions for ultrasonication treatment are ½ hour immersion in bath with 42 KHZ frequency at 100 W output. Particle size distribution can be measured by using any suitable technique such as Disc Centrifuge (DC) method or Dynamic Light Scattering (DLS). Changes in size distribution can be characterized in terms of changes in mean particle size or D50 (50% particles below this size) or D99 (99% particles below this size) or any similar parameters.

Preferably the changes in particle size distribution of ceria coated silica particles after ultrasonication treatment is less than 10%, more preferably less than 5% or most preferably less than 2%; by using for example DC and mean particle size, D50, D75 and/or D99. Using such stable particles in CMP slurry compositions would allow more effective utilization of polishing forces for film material removal and would also prevent generation of any irregular shapes that would contribute to scratching defects Since advanced CMP applications require extremely low levels metals such as sodium on the dielectric surface after polishing, it is desired to have very low trace metals, especially sodium in the polishing compositions. In certain preferred embodiments the compositions comprise abrasive particles that have less than 5 ppm, more preferably less than 1 ppm most preferably less than 0.5 ppm of sodium impurity levels for each percent of particles in the compositions by weight.

Polishing compositions of this invention may comprise abrasive particles in the concentration range of 0.001 wt. % to about 15 wt. %, or more preferably between 0.01 wt. % to about 5 wt. %, or most preferably between 0.05 wt. % to about 3 wt. %.

In certain embodiments, both elemental Si containing films and silicon oxide films need to be polished at high rates (>500 Å/min at 4 psi downforce) while at the same time remove elemental silicon films at rates which are preferably 1.5 times or more preferably more than 2 times faster than the removal rate of silicon oxide films.

Polishing compositions for this embodiment comprise at least two types of abrasive particles, wherein first particle is a cerium oxide containing abrasive particles and second particle is silica; a removal rate booster for elemental silicon films comprising isothiazolinone and thiazolinone compounds. Concentration of cerium oxide containing abrasive particles may preferably between 0.01 to 5 wt. %, or more preferably between 0.02 and 1 wt. %. Concentration of silica particles is preferably between 0.01 and 5 wt. % or more preferably between 0.1 and 2 wt. %.

Some other embodiments may additionally require removal rates of silicon nitride films may be much lower compared to elemental silicon and silicon oxide films.

Polishing compositions for these embodiments would additionally comprise compounds to suppress silicon nitride removal rate.

These additive may include, but is not limited to compounds having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof. Preferred additive are polymers or copolymers comprising acrylic acid groups. A preferred polymer is ammonium polyacrylate.

In yet another embodiment, elemental silicon films can be polished at high rates along with metallic films (for example copper, tungsten) as is required for polishing applications such as through-Via-Silicon (TSV) CMP.

Liquid carrier in the CMP composition may comprise water.

Polishing compositions may also comprise other types of chemical additives for additional purposes such as boosting oxide rates, reducing silicon nitride rates, boosting removal rate of metallic films, corrosion inhibitors for metallic films, etc.

These additive may include, but is not limited to compounds having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, triazole compounds, and combinations thereof.

Preferred additive are polymers or copolymers comprising acrylic acid groups. A preferred polymer is ammonium polyacrylate. Molecular weight range of polyacrylic acid or its salt may range from 1.00 to 5,000,000 or preferably between 500 to 100,000 or most preferably between 1,000 and 20,000.

The amount of chemical additive ranges from about 0.1 ppm to 0.5 wt. % relative to the total weight of the barrier CMP composition. The preferred range is from about 200 ppm to 0.3% and more preferred range is from about 500 ppm to 0.15 wt. %.

Polishing compositions may also comprise pH adjusting agents or pH buffering additives or both in order to achieve and maintain the pH of the composition.

The pH adjusting agent includes, but is not limited to, sodium hydroxide, cesium hydroxide, potassium hydroxide, cesium hydroxide, ammonium hydroxide, quaternary organic ammonium hydroxide (e.g. tetramethylammonium hydroxide) and mixtures thereof.

The pH buffering agent may comprise a salt of an organic or inorganic acid with a base. Suitable pH buffering agents include but not limited to salts of polyacrylic acid, citric acid, acetic acid, carbonic acid, bicine, tricine, Tris, 4-(2-hydroxyethyl)-1-piperazineethanesulfonic acid, N-cyclohexyl-3-aminopropanesulfonic acid, 3-(N-morpholino)propanesulfonic acid, and piperazine-N,N-bis(2-ethanesulfonic acid).

The amount of pH-adjusting agent or pH buffering agent or both ranges from about 0.0001 wt. % to about 5 wt. % relative to the total weight of the CMP composition. The preferred range is from about 0.0005 wt. % to about 1 wt. %, and more preferred range is from about 0.0005 wt. % to about 0.5 wt. %

Typically, pH of the polishing composition is between 1 and 13, preferably between 2 and 12 and more preferably between 3 and 10. Polishing compositions with higher pH would yield higher poly-Si rate. However, at higher pH especially beyond 8, removal rate of silicon oxide or silicon nitride films may also increase. For certain applications where it is necessary to have very low silicon oxide or silicon nitride removal rate, preferred pH range may be between 4 to 10.

The CMP composition may comprise a surfactant.

The surfactant includes, but is not limited to, a). Non-ionic surface wetting agents; b). Anionic surface wetting agents; c). Cationic surface wetting agents; d). ampholytic surface wetting agents; and mixtures thereof.

Non-ionic surfactants may be chosen from a range of chemical types including but not limited to long chain alcohols, ethoxylated alcohols, ethoxylated acetylenic diol surfactants, polyethylene glycol alkyl ethers, proplylene glycol alkyl ethers, glucoside alkyl ethers, polyethylene glycol octylphenyl ethers, polyethylene glycol alkylpgenyl ethers, glycerol alkyl esters, polyoxyethylene glycol sorbiton alkyl esters, sorbiton alkyl esters, cocamide monoethanol amine, cocamide diethanol amine dodecyl dimethylamine oxide, block copolymers of polyethylene glycol and polypropylene glycol, polyethoxylated tallow amines, fluorosurfactants. The molecular weight of surfactants may range from several hundreds to over 1 million. The viscosities of these materials also possess a very broad distribution.

Anionic surfactants include, but are not limited to salts with suitable hydrophobic tails, such as alkyl carboxylate, alkyl polyacrylic salt, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy sulfate, alkoxy biphosphate, such as substituted aryl carboxylate, substituted aryl sulfate, substituted aryl phosphate, substituted aryl bicarboxylate, substituted aryl bisulfate, substituted aryl biphosphate etc.

The counter ions for this type of surface wetting agents include, but are not limited to potassium, ammonium and other positive ions. The molecular weights of these anionic surface wetting agents range from several hundred to several hundred-thousands.

Cationic surface wetting agents possess the positive net charge on major part of molecular frame. Cationic surfactants are typically halides of molecules comprising hydrophobic chain and cationic charge centers such as amines, quaternary ammonium, benzyalkonium and alkylpyridinium ions.

Yet, in another aspect, the surfactant can be an ampholytic surface wetting agents possess both positive (cationic) and negative (anionic) charges on the main molecular chains and with their relative counter ions. The cationic part is based on primary, secondary, or tertiary amines or quaternary ammonium cations. The anionic part can be more variable and include sulfonates, as in the sultaines CHAPS (3-[(3-Cholamidopropyl)dimethylammonio]-1-propanesulfonate) and cocamidopropyl hydroxysultaine. Betaines such as cocamidopropyl betaine have a carboxylate with the ammonium. Some of the ampholytic surfactants may have a phosphate anion with an amine or ammonium, such as the phospholipids phosphatidylserine, phosphatidylethanolamine, phosphatidylcholine, and sphingomyelins.

Examples of surfactants also include, but are not limited to, dodecyl sulfate sodium salt, sodium lauryl sulfate, dodecyl sulfate ammonium salt, secondary alkane sulfonates, alcohol ethoxylate, acetylenic surfactant, and any combination thereof.

Examples of suitable commercially available surfactants include TRITON™, Tergitol™, DOWFAX™ family of surfactants manufactured by Dow Chemicals and various surfactants in SURFYNOL™, DYNOL™, Zetasperse™, Nonidet™, and Tornado™ surfactant families, manufactured by Air Products and Chemicals.

Suitable surfactants may also include polymers comprising ethylene oxide (EO) and propylene oxide (PO) groups. An example of EO-PO polymer is Tetronic™ 90R4 from BASF Chemicals.

Other surfactants that have functions of dispersing agents and/or wetting agents include, but are not limited to, polymeric compounds which may have anionic or cationic or nonionic or zwitterionic characteristics. Examples are polymers/copolymers containing functional groups such as acrylic acid, maleic acid, sulfonic acid, vinyl acid, ethylene oxide, etc.

The amount of surfactant ranges from about 0.0001 wt. % to about 10 wt. % relative to the total weight of the CMP composition. The preferred range is from about 0.001 wt. % to about 1 wt. %, and more preferred range is from about 0.005 wt. % to about 0.1 wt. %.

The CMP composition may comprise biological growth inhibitors or preservatives to prevent bacterial and fungal growth during storage.

The biological growth inhibitors include, but are not limited to, tetramethylammonium chloride, tetraethylammonium chloride, tetrapropylammonium chloride, alkylbenzyldimethylammonium chloride, isothiazolin compounds and alkylbenzyldimethylammonium hydroxide, wherein the alkyl chain ranges from 1 to about 20 carbon atoms, sodium chlorite, and sodium hypochlorite.

Some of the commercially available preservatives include KATHON™ and NEOLENE™ product families from Dow Chemicals, and Preventol™ family from Lanxess. More are disclosed in U.S. Pat. No. 5,230,833 (Romberger et al.) and US Patent Application No. US 20020025762. The contents of which are hereby incorporated by reference as if set forth in their entireties.

In certain embodiments, the slurry can be manufactured in a concentrated form and be diluted at point of use with water. In some other embodiments, slurry can be manufactured in two or more components, that may be mixed at point of use along with optional dilution with water in order to overcome potential issues such as particle stability in slurries, cost of shipping etc.

WORKING EXAMPLES

Polishing Pad IC1010 pad, supplied by Dow Corporation; and soft Fujibo polishing pad supplied by Fujibo, were used for CMP process.

TEOS oxide films by Chemical Vapor Deposition (CVD) using tetraethylorthosilicate as the precursor HDP oxide films made by high density plasma (HDP) technique SiN films—Silicon nitride films Parameters:

Å: angstrom(s)—a unit of length

BP: back pressure, in psi units

CMP: chemical mechanical planarization=chemical mechanical polishing

CS: carrier speed

DF: Down force: pressure applied during CMP, units psi min: minute(s)

ml: milliliter(s)

mV: millivolt(s)

psi: pounds per square inch

PS: platen rotational speed of polishing tool, in rpm (revolution(s) per minute)

SF: polishing composition flow, ml/min

Removal Rates and Selectivity

Removal Rate (RR)=(film thickness before polishing–film thickness after polishing)/polish time.

Selectivity of TEOS/SiN=TEOS RR/SiN RR; TEOS/poly-Si=TEOS RR/poly-Si RR at same down force (psi)

All percentages are weight percentages unless otherwise indicated.

General Experimental Procedure

In the examples presented below, CMP experiments were run using the procedures and experimental conditions given below.

The CMP tool that was used in the examples is a Mirra®, manufactured by Applied Materials, 3050 Boweres Avenue, Santa Clara, Calif., 95054. IC1010 pad, supplied by Dow Electronic Chemicals, was used on the platen for the blanket wafer polishing studies. Pads were broken-in by polishing twenty-five dummy oxide (deposited by plasma enhanced CVD from a TEOS precursor, PETEOS) wafers

Example 1

Polishing compositions were made as per the compositions listed in table 1.

Methyl-isothiazolinone was purchased from Dow Chemicals (USA) under trade name Neolone M-10.

PL-2 and PL-2L silica abrasive were purchased from Fuso Chemical Company (Tokyo, Japan).

Particle size as measured by dynamic light scattering was approximately 50 nm.

Ceria coated silica particles were manufactured by JGC Catalysts and Chemicals Ltd (16th Floor, Solid Square East Tower, 580 Horikawa-cho, Saiwai-ku, Kawasaki City, Kanagawa 212-0013 JAPAN).

TABLE 1

| | Compositions | | | | |
|---|---|---|---|---|---|
| Composition# | 1 | 2 | 3 | 4 | 5 |
| Methylisothiazolinone (wt. %) | 0.05 | 0.05 | 0.015 | 0.05 | 0.05 |
| Fuso PL-2 Silica particles (wt. %) | 1 | 1 | 1 | | |
| Ceria coated silica particles (wt. %) | — | — | | 0.3 | 0.3 |
| Ammonium Polyacrylate (wt. %) | 0.1 | 0.1 | 0.1 | 0.1 | 0.2 |
| Water | balance | balance | balance | balance | balance |
| pH | 5 | 6 | 5 | 5 | 5 |

Wafers were polished at 4 psi downforce and 85 RPM table speed.

Table 2 summarized removal rate data on various films with polishing compositions shown in table 1.

TABLE 2

| | Removal Rates | | | | |
|---|---|---|---|---|---|
| | Poly-Si removal rate (Å/min) | TEOS removal rate (Å/min) | SiN removal rate (Å/min) | Poly-Si/TEOS removal rare Selectivity | Poly-Si/SiN removal rate selectivity |
| 1 | 1451 | 43 | 11 | 44 | 132 |
| 2 | 1952 | 1 | 28 | 1952 | 70 |
| 3 | 1274 | 33 | 12 | 39 | 106 |
| 4 | 1573 | 2748 | 129 | 0.57 | 12 |
| 5 | 1626 | 1915 | 128 | 0.85 | 13 |

Comparison of poly-Si rates between composition 1 and composition 2 showed the beneficial impact of increasing pH resulted in the increased poly-Si removal rates.

Composition 1 comprising higher methyl-isothialozinone concentration (0.05 wt. %) showed higher removal rate compared to composition 3 comprising only 0.015 wt. % methyl-isothialozinone concentration, demonstrating that methyl-isothialozinone acts as a booster of the poly-Si removal rates.

Compositions comprising ceria coated silica particles and methyl-isothialozinone show high removal rates of both poly-Si and TEOS films. By suitably choosing ammonium polyacrylate concentration, TEOS rate can be modulated to provide desired removal rate selectivity.

Example 2

Polishing compositions were made as per the compositions listed in table 3. The formulations used calcined ceria particles as abrasives.

TABLE 3

| Composition# | 6 (Comparative) | 7 | 8 |
|---|---|---|---|
| Methylisothiazolinone (wt. %) | 0 | 0.01 | 0.05 |
| Calcined Ceria particles (wt. %) | 0.5 | 0.5 | 0.5 |
| Ammonium Polyacrylate ((wt. %) | 0.077 | 0.077 | 0.077 |
| Water | balance | balance | balance |
| pH | 5.2 | 5.2 | 5.2 |

Wafers were polished at 4.7 psi downforce and 87 RPM table speed. Table 4 summarizes the removal rate data.

TABLE 4

Removal Rate

| | Poly-Si removal rate (Å/min) | TEOS removal rate (Å/min) | Poly-Si/TEOS removal rare Selectivity |
|---|---|---|---|
| 6 (Comparative) | 272 | 2139 | 0.127 |
| 7 | 1617 | 1838 | 0.88 |
| 8 | 1824 | 1766 | 1.03 |

Comparative Composition 6 did not contain methyl isothiazolinone compound giving very low poly-Si removal rate but high TEOS removal rate, resulting in a selectivity of Poly-Si/TEOS with 0.127.

As evident from the data, Compositions 7 and 8 contained methyl isothiazolinone compound showing very high poly-Si removal rate. Compositions 7 and 8 also achieved 1:1 removal rate selectivity between poly-Si and TEOS films which may be desired for certain applications Example 3

Compositions 9-12 were made comprising 1 wt. % Fuso PL2 particles, 500 ppm methyl isothiazolinone, 0.2 wt. % ammonium polyacrylate (Molecular weight 1000-5000) and water.

TABLE 5

Removal Rate

| Composition | pH | Poly-Si removal rate (Å/min) | TEOS removal rate (Å/min) | SiN removal rate (Å/min) |
|---|---|---|---|---|
| 9 | 6 | 2046 | 40 | 32 |
| 10 | 7 | 2258 | 15 | 31 |
| 11 | 8 | 2423 | 13 | 25 |
| 12 | 10 | 3447 | 20 | 33 | pH of these formulations was adjusted using ammonium hydroxide to values 6, 7, 8 and 10 respectively.

Table 5 summarizes the polishing data obtained at 4 psi and 85 RPM.

As evident from table 5, increasing the pH increases the poly-Si rate without adversely affecting TEOS and SiN removal rates. Thus, the removal rate selectivity between poly-Si and TEOS or SiN increases as well.

Example 4

Composition 13 was made comprising 1 wt. % aluminum containing silica particles with 30 nm particle size, 0.2 wt. % ammonium polyacrylate (molecular weight 1000-5000) and 0.05 wt. % methyl isothozolinone, with pH of 5.

Removal rates of Poly-Si, TEOS and SiN at 4 psi downforce and 85 RPM were 1870 Å/min, 29 Å/min and 33 Å/min respectively.

Composition comprising aluminum containing silica particles and methyl-isothialozinone showed high removal rate of poly-Si and low removal rates of TEOS or SIN films.

Example 5

Composition 14 was made comprising 1 wt. % Fuso PL2 silica particles with 30 nm particle size, 0.05 wt. % methyl isothozolinone and water with pH adjusted to pH of 5.

Removal rates of Poly-Si, TEOS and SiN at 4.5 psi downforce and 85 RPM were 2363 Å/min, 34 Å/min and 23 Å/min respectively.

This shows that methyl isothiazolinone addition by itself to the abrasive particles results in high poly-Si removal rates. The composition has low removal rates of TEOS or SIN films.

Example 6

Compositions were made comprising combination of ceria containing abrasive particles (Ceria coated silica particles) and silica particles as described in table 6.

Ceria coated silica particles were manufactured by JGC Catalysts and Chemicals Ltd (16th Floor, Solid Square East Tower, 580 Horikawa-cho, Saiwai-ku, Kawasaki City, Kanagawa 212-0013 JAPAN).

TABLE 6

| Composition# | 15 | 16 | 17 |
|---|---|---|---|
| Methylisothiazolinone (wt. %) | 0.05 | 0.05 | 0.015 |
| Fuso PL-2L Silica particles (wt. %) | 0 | 0.5 | 1 |
| Ceria coated silica particles (wt. %) | 0.1 | 0.1 | 0.1 |
| Ammonium Polyacrylate (wt. %) | 0.05 | 0.05 | 0.05 |
| Water | balance | balance | balance |
| pH | 6 | 6 | 6 |

Removal rates obtained with poly-Si, TEOS and SiN films at 4 psi downforce and 85 RPM table speed were summarized in table 7

As shown in example 15, ceria containing abrasive particles (Ceria coated silica particles) provided high silicon oxide removal rates relative to poly-Si removal rates.

TABLE 7

| | Poly-Si removal rate (Å/min) | TEOS removal rate (Å/min) | SiN removal rate (Å/min) | Poly-Si/TEOS removal rare Selectivity | Poly-Si/SiN removal rate selectivity |
|---|---|---|---|---|---|
| 15 | 1079 | 1823 | 61 | 0.59 | 17.68 |
| 16 | 2969 | 1621 | 57 | 1.83 | 52.08 |
| 17 | 3027 | 1175 | 47 | 2.57 | 64.4 |

However, with addition of silica particles (PL-2L silica particles from Fuso Ltd), there was substantial boost in poly-Si removal rates, resulting in poly-Si to TEOS removal rate selectivity as high as 2.57. Combination of ceria containing particles (Ceria coated silica particles) and silica particles also provided significant improvement in poly-Si to silicon nitride removal rate selectivity.

Compositions in working examples have shown a remarkable removal rate selectivity between elemental silicon and silicon oxide or SiN ranging from 0.1 to 110. This tunable selectivity is very useful in the semiconductor process.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A polishing method for chemical mechanical planarization of a semiconductor substrate comprising at least one surface containing elemental silicon, comprising the steps of: contacting the at least one surface containing elemental silicon with a polishing pad; delivering a polishing composition to the at least one surface containing elemental silicon; wherein the polishing composition consisting essentially of: abrasive particles ranging from 0.01 wt. % to 15 wt. %; a compound to enhance removal rate of films comprising elemental silicon ranging from 0.001 wt. % to 0.5 wt. %; liquid carrier; and optionally an additive selected from the group consisting of (i) a polyacrylic acid or its salts with molecular weight ranging between 500 and 100,000; (ii) an additive having a functional group selected from the group consisting of organic carboxylic acids and salts thereof, amino acids and salts thereof, aminocarboxylic acids and salts thereof, N-acylamino acids and salts thereof, organic sulfonic acids and salts thereof, organic phosphonic acids and salts thereof, polymeric carboxylic acids and salts thereof, polymeric sulfonic acids and salts thereof, polymeric phosphonic acids and salts thereof, arylamines, aminoalcohols, aliphatic amines, heterocyclic amines, hydroxamic acids, substituted phenols, sulfonamides, thiols, polyols having hydroxyl groups, and combinations thereof; and combinations of (i) and (ii); a pH adjusting agent; a surfactant selected from the group consisting of a) non-ionic surface wetting agents; b) anionic surface wetting agents; c) cationic surface wetting agents; d) ampholytic surface wetting agents; and mixtures thereof; and a biological growth inhibitors or preservatives to prevent bacterial and fungal growth during storage; wherein pH of the polishing composition is between 2 and 12; wherein the abrasive particles are selected from the group consisting of fumed silica, colloidal silica, fumed alumina, colloidal alumina, cerium oxide, ceria-silica composite particles, titanium dioxide, zirconium oxide, polystyrene, polymethyl methacrylate, mica, hydrated aluminum silicate, and combinations thereof; and wherein the compound to enhance removal rate of films comprising elemental silicon is selected from the group consisting of isothiazolinone and derivatives, thiazolinone and derivatives, imidazolidine and derivatives, pyrozolidine and derivatives, imidazole and derivatives, pyrazole and derivatives, thiazole and derivatives, isothiazole, and derivatives, thiazolidine and derivatives, isothiazolidine and derivatives, dithiolane and derivatives, triazole and derivatives, tetrazole and derivatives, thiadiazole and derivatives, acetone, benzophenone, acetophenone, acetylacetone, butanol, 3-hydroxybutanal, p-nitrobenzenzaaldehyde, cinnamaldehyde, vanillin, and combinations thereof; and polishing the at least one surface containing elemental silicon with the polishing composition.

2. The polishing method of claim 1, wherein the compound to enhance removal rate of films comprising elemental silicon is selected from the group consisting of (i) isothiazolinone and derivative selected from the group consisting of methylisothiazolinone (MIT), chloromethylisothiazolinone (CMIT), benzisothiazolinone (BIT), octylisothiazolinone (OIT), dichlorooctylisothiazolinone (DCOIT), butylbenzisothiazolinone (BBIT), and combinations thereof; and (ii) thiazolinone and derivative selected from the group consisting of 2-Benzothiazol-1, 1,3-trione (Saccharin), N-methyl 2-Benzothiazolinone, thiazolinone, and combinations thereof; and combinations thereof.

3. The polishing method of claim 1, wherein the polishing composition comprises methylisothiazolinone (MIT); the liquid carrier is water; and the pH of the polishing composition is between 4 and 10.

4. The polishing method of claim 3, wherein the polishing composition comprises methylisothiazolinone (MIT); ammonium polyacrylate with molecular weight ranging between 500 and 100,000; the liquid carrier is water; and the pH of the polishing composition is between 4 and 10.

5. The polishing method of claim 1, wherein the semiconductor substrate further comprises at least one surface containing silicon oxide, silicon nitride or combinations thereof; and wherein the removal rate selectivity between elemental silicon and silicon oxide or silicon nitride is tunable between 0.1 to 110.

6. The polishing method of claim 1, wherein the polishing composition comprises at least one of
(1) the pH adjusting agent selected from the group consisting of sodium hydroxide, cesium hydroxide, potassium hydroxide, cesium hydroxide, ammonium hydroxide, quaternary organic ammonium hydroxide (e.g. tetramethylammonium hydroxide), salts of polyacrylic acid, citric acid, acetic acid, carbonic acid, bicine, tricine, Tris, 4-(2-hydroxyethyl)-1-piperazineethanesulfonic acid, N-cyclohexyl-3-aminopropanesulfonic acid, 3-(N-morpholino)propanesulfonic acid, and piperazine-N,N-bis(2-ethanesulfonic acid), and mixtures thereof; wherein the pH adjusting agent ranges from 0.0005% to 1 wt. %;
(2) the surfactant ranging from 0.001 wt. % to about 1 wt. %; and
(3) the biological growth inhibitors or preservatives.

7. A method for selectively increasing or decreasing the removal rate of elemental silicon in relation to a compound of silicon during chemical mechanical planarization of a semiconductor substrate, comprising the steps of:

a) contacting, with a polishing pad, a semiconductor substrate comprising a first surface containing elemental silicon and a second surface comprising a compound of silicon;
b) providing a polishing composition comprising abrasive particles, a liquid carrier and a first additive selected from the group consisting of isothiazolinone and derivatives, thiazolinone and derivatives, imidazolidine and derivatives, pyrozolidine and derivatives, imidazole and derivatives, pyrazole and derivatives, thiazole and derivatives, isothiazole and derivatives, thiazolidine and derivatives, isothiazolidine and derivatives, dithiolane and derivatives, triazole and derivatives, tetrazole and derivatives, thiadiazole and derivatives, acetone, benzophenone, acetophenone, acetylacetone, butanol, 3-hydroxybutanal, p-nitrobenzenzaaldehyde, cinnamaldehyde, vanillin, and combinations thereof, wherein the first additive comprises a first additive concentration and a second additive selected from the group consisting of (i) a polyacrylic acid or its salts with molecular weight ranging between 500 and 100,000; (ii) an additive having a functional group selected from the group consisting of organic carboxylic acids and salts thereof, amino acids and salts thereof, amidocarboxylic acids and salts thereof, N-acylamino acids and salts thereof, organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof; and combinations of (i) and (ii);
c) contacting the polishing composition with the first and second surfaces and the polishing pad;
d) polishing the first and second surfaces with the polishing pad and the polishing composition to produce a first removal rate of the first surface and a second removal rate of the second surface, wherein a removal rate selectivity is defined by the ratio of the first removal rate to the second removal rate;
e) tuning the removal rate selectivity, wherein the tuning is accomplished by varying the first additive concentration and the second additive concentration.

8. The method of claim 7 wherein the abrasive particles are selected from the group consisting of fumed silica, colloidal silica, fumed alumina, colloidal alumina, cerium oxide, ceria-silica composite particles, titanium dioxide, zirconium oxide, polystyrene, polymethyl methacrylate, mica, hydrated aluminum silicate, and combinations thereof.

9. The method of claim 7, wherein the first additive concentration ranges from 0.0001 to 1 percent by weight of the polishing composition.

10. The method of claim 7, wherein the second additive concentration ranges from 0.1 part per million by weight to 0.5 percent by weight of the polishing composition.

11. The method of claim 7, wherein the step e further comprises tuning a removal rate selectivity between elemental silicon and silicon oxide or silicon nitride between 0.1 and 110.

12. A method comprising:
a) preparing a polishing composition comprising abrasive particles, a liquid carrier and a first additive selected from the group consisting of isothiazolinone and derivatives, thiazolinone and derivatives, imidazolidine and derivatives, pyrozolidine and derivatives, imidazole and derivatives, pyrazole and derivatives, thiazole and derivatives, isothiazole and derivatives, thiazolidine and derivatives, isothiazolidine and derivatives, dithiolane and derivatives, triazole and derivatives, tetrazole and derivatives, thiadiazole and derivatives, acetone, benzophenone, acetophenone, acetylacetone, butanol, 3-hydroxybutanal, p-nitrobenzenzaaldehyde, cinnamaldehyde, vanillin, and combinations thereof, the first additive having a first additive concentration representing a weight percentage of the polishing compound provided by the first additive;
b) placing the polishing compound in contact with at least one selected from the group of a polishing pad and a semiconductor substrate having a first film comprising elemental silicon and a second film comprising a compound of silicon;
c) polishing the first and second films with the polishing pad and the polishing composition resulting in a first removal rate of the first film and a second removal rate of the second film, wherein the first removal rate is different from the second removal rate;
d) prior to performing the step a), selecting the first additive and the first additive concentration to produce a desired removal rate selectivity, the removal rate selectivity being a ratio of the first removal rate to the second removal rate; and
e) after performing steps (a) through (d) at least once, changing the first additive concentration selected in step (d) to more closely produce the desired removal rate selectivity.

13. The method of claim 12 wherein steps (a) and (d) comprise:
a) preparing the polishing composition comprising abrasive particles, the liquid carrier the first additive and a second additive, the first additive selected from the group consisting of isothiazolinone and derivatives, thiazolinone and derivatives, imidazolidine and derivatives, pyrozolidine and derivatives, imidazole and derivatives, pyrazole and derivatives, thiazole and derivatives, isothiazole and derivatives, thiazolidine and derivatives, isothiazolidine and derivatives, dithiolane and derivatives, triazole and derivatives, tetrazole and derivatives, thiadiazole and derivatives, acetone, benzophenone, acetophenone, acetylacetone, butanol, 3-hydroxybutanal, p-nitrobenzenzaaldehyde, cinnamaldehyde, vanillin, and combinations thereof, the second additive selected from the group consisting of (i) a polyacrylic acid or its salts with molecular weight ranging between 500 and 100,000; (ii) an additive having a functional group selected from the group consisting of organic carboxylic acids and salts thereof, amino acids and salts thereof, amidocarboxylic acids and salts thereof, N-acylamino acids and salts thereof, organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof; and combinations of (i) and (ii); wherein the first additive having the first additive concentration representing the weight percentage of the polishing compound provided by the first additive, the second additive having a second additive concentration representing a weight percentage of the polishing compound provided by the second additive;

d) selecting each of the first additive concentration and the second additive concentration to produce a desired removal rate selectivity, the removal rate selectivity being the ratio of the first removal rate to the second removal rate.

\* \* \* \* \*